United States Patent
Bao et al.

Patent No.: US 6,455,417 B1
Date of Patent: Sep. 24, 2002

(54) METHOD FOR FORMING DAMASCENE STRUCTURE EMPLOYING BI-LAYER CARBON DOPED SILICON NITRIDE/ CARBON DOPED SILICON OXIDE ETCH STOP LAYER

(75) Inventors: Tien-I Bao; Syun-Ming Jang, both of Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/899,419

(22) Filed: Jul. 5, 2001

(51) Int. Cl.[7] .......................................... H01L 21/4763
(52) U.S. Cl. ........................................ 438/637; 438/624
(58) Field of Search ................................ 438/624, 627, 438/634, 637, 643, 778

(56) References Cited

U.S. PATENT DOCUMENTS 6,054,379 A    4/2000   Yau et al. .................... 438/623
6,072,227 A    6/2000   Yau et al. .................... 257/642
6,174,797 B1 * 1/2001   Bao et al.
6,362,091 B1 * 3/2002   Andideh et al.

\* cited by examiner

Primary Examiner—David Nelms
Assistant Examiner—Phuc T. Dang
(74) Attorney, Agent, or Firm—Tung & Associates

(57) ABSTRACT

Within a damascene method for forming a microelectronic fabrication, there is employed a first etch stop/liner layer formed upon a substrate, wherein the first etch stop/liner layer comprises a first layer formed upon the substrate and formed of a carbon doped silicon nitride material and a second layer formed upon the first layer and formed of a carbon doped silicon oxide material. The first etch stop/liner layer formed in accord with the above materials selections provides for attenuated oxidation of the substrate and attenuated residue formation of a photoresist layer coated, photo exposed and developed in contact with the first etch stop/ liner layer.

15 Claims, 2 Drawing Sheets

METHOD FOR FORMING DAMASCENE STRUCTURE EMPLOYING BI-LAYER CARBON DOPED SILICON NITRIDE/CARBON DOPED SILICON OXIDE ETCH STOP LAYER

BACKGROUND OF THE INVENTION

1. Field of the Invention

The present invention relates generally to methods for forming damascene structures within microelectronic fabrications. More particularly, the present invention relates to methods for forming, with enhanced reliability, damascene structures within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common in the art of microelectronic fabrication to employ interposed between the patterns of patterned microelectronic conductor layers when fabricating microelectronic fabrications microelectronic dielectric layers formed of comparatively low dielectric constant dielectric materials. Such comparatively low dielectric constant dielectric materials generally have dielectric constants. For comparison purposes, microelectronic dielectric layers formed within microelectronic fabrications from conventional silicon oxide dielectric materials, silicon nitride dielectric materials and silicon oxynitride dielectric materials typically have comparatively high dielectric constants. Similarly, such patterned microelectronic conductor layers having formed interposed between their patterns microelectronic dielectric layers formed of comparatively low dielectric constant dielectric materials are typically formed within microelectronic fabrications while employing damascene methods, including in particular dual damascene methods.

Microelectronic dielectric layers formed of comparatively low dielectric constant dielectric materials are desirable in the art of microelectronic fabrication formed interposed between the patterns of patterned microelectronic conductor layers within microelectronic fabrications insofar as such microelectronic dielectric layers formed of dielectric materials having comparatively low dielectric constants provide microelectronic fabrications which may theoretically operate at higher microelectronic fabrication speeds, with attenuated patterned microelectronic conductor layer parasitic capacitance and attenuated patterned microelectronic conductor layer cross-talk.

Similarly, damascene methods are desirable in the art of microelectronic fabrication for forming patterned microelectronic conductor layers having formed interposed between their patterns microelectronic dielectric layers formed of comparatively low dielectric constant dielectric materials insofar as damascene methods are comparatively simple fabrication methods which may often be employed to fabricate microelectronic structures which are not otherwise practicably accessible in the art of microelectronic fabrication.

While damascene methods are thus desirable in the art of microelectronic fabrication for forming patterned microelectronic conductor layers having formed interposed between their patterns microelectronic dielectric layers formed of comparatively low dielectric constant dielectric materials within microelectronic fabrications, damascene methods are nonetheless not entirely without problems in the art of microelectronic fabrication for forming patterned microelectronic conductor layers having formed interposed between their patterns microelectronic dielectric layers formed of comparatively low dielectric constant dielectric materials within microelectronic fabrications. In that regard, while damascene methods are generally successful for forming patterned microelectronic conductor layers having formed interposed between their patterns microelectronic dielectric layers formed of comparatively low dielectric constant dielectric materials within microelectronic fabrications, such damascene methods are often difficult to employ for forming, with high reliability, patterned microelectronic conductor layers having formed interposed between their patterns microelectronic dielectric layers formed of comparatively low dielectric constant dielectric materials within microelectronic fabrications.

It is thus desirable in the art of microelectronic fabrication to provide damascene methods which may be employed in the art of microelectronic fabrication for providing patterned microelectronic conductor layers having formed interposed between their patterns microelectronic dielectric layers formed of comparatively low dielectric constant dielectric materials, with enhanced reliability.

It is towards the foregoing object that the present invention is directed.

Various damascene methods have been disclosed in the art of microelectronic fabrication for forming within microelectronic fabrications damascene structures with desirable properties in the art of microelectronic fabrication.

Included among the damascene methods, but not limited among the damascene methods, are damascene methods disclosed within Yao et al., in U.S. Pat. Nos. 6,054,379 and 6,072,227 (a pair of methods and apparatus for forming within a microelectronic fabrication a multiplicity of dielectric layers formed of comparatively low dielectric constant dielectric materials in turn formed incident to oxidation of an organosilane, preferably methylsilane, silicon and carbon source material, wherein the dielectric layers may be employed as etch stop layers, as well as other types of layers, within microelectronic fabrication structures within microelectronic fabrications including but not limited to dual damascene microelectronic fabrication structures within microelectronic fabrications).

Desirable in the art of microelectronic fabrication are additional damascene methods and materials which may be employed in the art of microelectronic fabrication for providing patterned microelectronic conductor layers having formed interposed between their patterns microelectronic dielectric layers formed of comparatively low dielectric constant dielectric materials, with enhanced reliability.

It is towards the foregoing object that the present invention is directed.

SUMMARY OF THE INVENTION

A first object of the present invention is to provide a damascene method for forming within a microelectronic fabrication a patterned microelectronic conductor layer having formed interposed between its patterns a microelectronic dielectric layer formed of a comparatively low dielectric constant dielectric material.

A second object of the present invention is to provide a damascene method in accord with the first object of the present invention, wherein the patterned microelectronic conductor layer is formed with enhanced reliability.

A third object of the present invention is to provide a damascene method in accord with the first object of the present invention and the second object of the present invention, wherein the damascene method is readily commercially implemented.

In accord with the objects of the present invention, there is provided by the present invention a method for fabricating a microelectronic fabrication.

To practice the method of the present invention, there is first provided a substrate. There is then formed upon the substrate a barrier layer, where the barrier layer comprises: (1) a carbon doped silicon nitride layer formed upon the substrate; and (2) a carbon doped silicon oxide layer formed upon the carbon doped silicon nitride layer.

Within the method of the present invention, and when the barrier layer is formed as a first etch stop/liner layer upon a substrate having formed therein a contact region which is accessed employing a damascene structure within the microelectronic fabrication, the method of the present invention provides for: (1) attenuated oxidation of the contact region when forming the first etch stop/liner layer; and (2) attenuated residue formation when forming, photo exposing and developing a photoresist layer upon the first etch stop/barrier layer, thus in turn providing enhanced reliability of a patterned conductor layer formed within the damascene structure within which is formed the barrier layer of the present invention.

There is provided by the present invention a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is formed with enhanced reliability.

The present invention realizes the foregoing object by forming upon a substrate employed within a microelectronic fabrication a barrier layer, where the barrier layer comprises: (1) a carbon doped silicon nitride layer formed upon the substrate; and (2) a carbon doped silicon oxide layer formed upon the carbon doped silicon nitride layer.

Within the method of the present invention, and when the barrier layer is formed as a first etch stop/liner layer upon a substrate having formed therein a contact region which is accessed employing a damascene structure within the microelectronic fabrication, the method of the present invention provides for: (1) attenuated oxidation of the contact region when forming the first etch stop/liner layer; and (2) attenuated residue formation when forming, photo exposing and developing a photoresist layer upon the first etch stop/barrier layer, thus in turn providing enhanced reliability of a patterned conductor layer formed within the damascene structure within which is formed the barrier layer of the present invention.

The method in accord with the present invention is readily commercially implemented.

As will be illustrated in greater detail within the context of the Description of the Preferred Embodiment, as set forth below, the method of the present invention employs methods and materials as are otherwise generally known in the art of microelectronic fabrication, but employed within the context of specific process limitations and specific materials limitations to provide the method of the present invention. Since it is thus at least in part a series of specific process limitations and specific materials limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is formed with enhanced reliability.

The present invention realizes the foregoing object by forming upon a substrate employed within a microelectronic fabrication a barrier layer, where the barrier layer comprises: (1) a carbon doped silicon nitride layer formed upon the substrate; and (2) a carbon doped silicon oxide layer formed upon the carbon doped silicon nitride layer.

Within the method of the present invention, and when the barrier layer is formed as a first etch stop/liner layer upon a substrate having formed therein a contact region which is accessed employing a damascene structure within the microelectronic fabrication, the method of the present invention provides for: (1) attenuated oxidation of the contact region when forming the first etch stop/liner layer; and (2) attenuated residue formation when forming, photo exposing and developing a photoresist layer upon the first etch stop/barrier layer, thus in turn providing enhanced reliability of a patterned conductor layer formed within the damascene structure within which is formed the barrier layer of the present invention.

Although the preferred embodiment of the present invention provides particular value within the context of forming, while employing a dual damascene method, and within a semiconductor integrated circuit microelectronic fabrication and with enhanced reliability, a patterned conductor layer having formed interposed between its patterns a dielectric layer formed of a comparatively low dielectric constant dielectric material, the present invention may nonetheless be employed for forming, with enhanced reliability, a patterned microelectronic conductor layer having formed interposed between its patterns a microelectronic dielectric layer formed of a comparatively low dielectric constant dielectric material, while employing a damascene method, within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 5, there is shown a series of schematic cross-sectional diagrams illustrating the results of progressive stages in forming, in accord with a preferred embodiment of the present invention, a patterned microelectronic conductor layer within a microelectronic fabrication while employing a dual damascene method.

Figure 1:
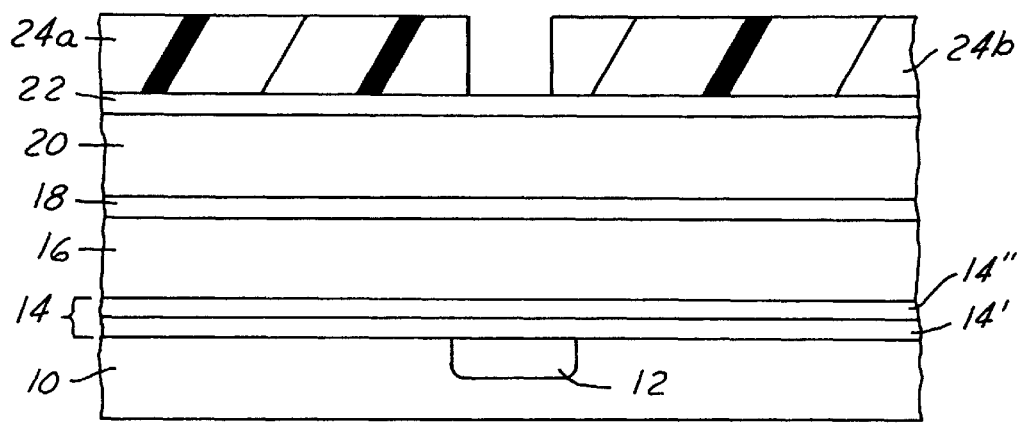
FIG. 1, FIG. 2, FIG. 3, FIG. 4 and FIG. 5 show a series of schematic cross-sectional diagrams illustrating the results of progressive stages of forming, in accord with a preferred embodiment of the present invention, a patterned conductor layer within a microelectronic fabrication while employing a damascene method in accord with the present invention.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiments of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the contact region 12, the contact region 12 is typically and preferably either: (1) a semiconductor contact region, particularly under circumstances where the substrate 10 consists of or comprises a semiconductor substrate as employed within a semiconductor integrated circuit microelectronic fabrication; or (2) a conductor contact region, under circumstances where the substrate 10 is employed within any of the several microelectronic fabrications as noted above. More typically and preferably, when the contact region 12 is a conductor contact region, the conductor contact region is formed employing a conductor metal or conductor metal alloy contact material, such as in particular a copper metal or a copper metal alloy.

Shown also within the schematic cross-sectional diagram of FIG. 1, and formed upon the substrate 10 having formed therein the contact region 12, is a series of layers comprising: (1) a blanket first etch stop/liner layer 14 formed upon the substrate 10 having formed therein the contact region 12; (2) a blanket first dielectric layer 16 formed upon the blanket first etch stop/liner layer 14; (3) a blanket second etch stop layer 18 formed upon the blanket first dielectric layer 16; (4) a blanket second dielectric layer 20 formed upon the blanket second etch stop layer 18; (5) a blanket third etch stop/planarizing stop layer 22 formed upon the blanket second dielectric layer 20; and (6) a pair of patterned photoresist layers 24a and 24b formed upon the blanket third etch stop/planarizing stop layer 22.

Within the preferred embodiment of the present invention with respect to the blanket first etch stop/liner layer 14, and as is illustrated within the schematic cross-sectional diagram of FIG. 1, the blanket first etch stop/liner layer 14 is formed as a bilayer laminate comprising a blanket lower lying first etch stop/liner layer 14' formed upon the substrate 10 having formed therein the contact region 12, wherein the blanket lower lying first etch stop/liner layer 14' in turn has formed thereupon a blanket upper lying first etch stop/liner layer 14". Within the present invention and the preferred embodiment of the present invention, the blanket lower lying first etch stop/liner layer 14' is formed of a carbon doped silicon nitride material, while the blanket upper lying first etch stop/liner layer 14" is formed of a carbon doped silicon oxide dielectric material. Similarly, within the present invention and the preferred embodiment of the present invention, both the carbon doped silicon nitride material and the carbon doped silicon oxide material are formed employing a plasma enhanced chemical vapor deposition (PECVD) method typically and preferably employing as a silicon and carbon source material an organosilane.

Similarly, within the present invention and the preferred embodiment of the present invention, and although any of several organosilane silicon and carbon source materials may be employed for forming the carbon doped silicon nitride material from which is formed the blanket lower lying first etch stop/liner layer 14' and the carbon doped silicon oxide material from which is formed the blanket upper lying first etch stop/liner layer 14", for the preferred embodiment of the present invention, both the carbon doped silicon nitride material and the carbon doped silicon oxide material are formed employing an organosilane such as is listed within the references cited within the Description of the Related Art (including but not limited to alkyl organosilanes, aryl organosilanes and alkyl-aryl organosilanes), the teachings of all of which related art is incorporated herein by reference. More typically and preferably, within the preferred embodiment of the present invention, the organosilane silicon and carbon source material which is employed for forming the carbon doped silicon nitride material and the carbon doped silicon oxide material is selected from the group including but not limited to (but also preferably consisting of) methylsilane, dimethylsilane, trimethylsilane and tetramethylsilane, with tetramethylsilane being most particularly preferred. Similarly, in order to form the carbon doped silicon nitride material, the organosilane silicon and carbon source material is preferably reacted with a nitrogen source material, such as but not limited to nitrogen, ammonia or hydrazine, and in order to form the carbon doped silicon oxide material, the organosilane silicon and carbon source material is preferably reacted with an oxygen source material, such as but not limited to oxygen, ozone, nitrous oxide, nitric oxide, carbon monoxide and carbon dioxide, but more preferably carbon dioxide.

Typically and preferably, the plasma enhanced chemical vapor deposition (PECVD) method also employs with respect to forming the blanket lower lying first etch stop/liner layer 14' of the carbon doped silicon nitride material upon a substrate: (1) a reactor chamber pressure of from about 0.1 to about 100 torr; (2) a radio frequency source power of from about 10 to about 10,000 watts at a source radio frequency of 13.56 MHZ and a radio frequency source power of from about 10 to about 10,000 watts at a source radio frequency of about 350 kHz; (3) a substrate 10 temperature of from about 200 to about 600 degrees centigrade; (4) a tetramethylsilane silicon and carbon source material flow rate of from about 10 to about 15,000 standard cubic centimeters per minute (sccm); (5) a nitrogen source material flow rate of from about 10 to about 5,000 standard cubic centimeters per minute (sccm); and a pressure of between about 0.1 Torr and about 100 Torr.

Typically and preferably, the plasma enhanced chemical vapor deposition (PECVD) method also employs with respect to forming the blanket upper lying first etch stop/liner layer 14" of the carbon doped silicon oxide material upon a substrate: (1) a reactor chamber pressure of from about 0.1 to about 100 torr; (2) a radio frequency source power of from about 10 to about 10,000 watts at a source radio frequency of 13.56 MHZ and a radio frequency source power of from about 10 to about 10,000 watts at a radio frequency of 350 kHz; (3) a substrate 10 temperature of from about 200 to about 600 degrees centigrade; (4) a silicon and carbon source material flow rate of from about 10 to about 5,000 standard cubic centimeters per minute (sccm); and (5) an oxygen source material flow rate of from about 5 to about 5,000 standard cubic centimeters per minute (sccm).

As is understood by a person skilled in the art, and in accord with the above source materials selections for forming the blanket lower lying first etch stop/liner layer 14" and the blanket upper lying first etch stop/liner layer 14", it is understood that by forming the blanket lower lying first etch stop/liner layer 14" of the carbon doped silicon nitride material, there is avoided oxidation of the substrate 10, and in particular the contact region 12 formed within the substrate, when forming the blanket first etch stop/liner layer 14.

As is further understood by a person skilled in the art, the blanket lower lying first etch stop/liner layer 14' and the blanket upper lying first etch stop/liner layer 14" may be formed employing separate plasma enhanced chemical vapor deposition (PECVD) methods employing separate plasma enhanced chemical vapor deposition (PECVD) reactor chambers or sequential and contiguous plasma enhanced chemical vapor deposition (PECVD) methods within a single plasma enhanced chemical vapor deposition (PECVD) reactor chamber, while appropriately introducing and adjusting source material flow rates.

Within the present invention and the preferred embodiment of the present invention with respect to the blanket second etch stop layer 18 and the blanket third etch stop/planarizing stop layer 22, and for reasons which will become clearer within the context of additional disclosure which follows, the blanket second etch stop layer 18 and the blanket third etch stop/planarizing stop layer 22 are typically and preferably formed of a single etch stop material, such as but not limited to a silicon carbide etch stop material or a carbon doped silicon oxide etch stop material, but not a silicon nitride etch stop material or a carbon doped silicon nitride etch stop material. Similarly, in part by avoiding within the present invention and the preferred embodiment of the present invention a pure silicon nitride material for any of the etch stop layers as illustrated within the schematic cross-sectional diagram of FIG. 1, there is provided a generally lower dielectric constant for the dielectric materials which are employed for forming the series of etch stop layers.

When formed of a carbon doped silicon oxide material, the blanket second etch stop layer 18 and the blanket third etch stop/planarizing stop layer 22 may be formed employing methods and materials analogous or equivalent to the methods and materials employed for forming the blanket upper lying first etch stop/liner layer 14". Similarly, when formed purely of a silicon carbide material, the blanket second etch stop layer 18 and the blanket third etch stop/planarizing stop layer 22 may be formed employing an otherwise generally analogous plasma enhanced chemical vapor deposition (PECVD) method, but employing a dichlorosilane silicon source material and a carbon source material (i.e. methane).

Typically and preferably, within the preferred embodiment of the present invention, the blanket first etch stop/liner layer 14 is formed to a thickness of from about 10 to about 1,000 angstroms (with the blanket lower lying first etch stop/liner layer 14' being formed to a thickness of from about 10 to about 1,000 angstroms and the blanket upper lying first etch stop/liner layer being formed to a thickness of from about 10 to about 1,000 angstroms), the blanket second etch stop layer 18 is formed to a thickness of from about 10 to about 1,000 angstroms and the blanket third etch stop/planarizing stop layer 22 is formed to a thickness of from about 10 to about 1,000 angstroms.

Within the preferred embodiment of the present invention with respect to the blanket first dielectric layer 16 and the blanket second dielectric layer 20, and while the blanket first dielectric layer 16 and the blanket second dielectric layer 22 may be formed from any of several comparatively low dielectric constant dielectric materials as are conventional or unconventional in the art of microelectronic fabrication, including but not limited to spin-on-glass (SOG) dielectric materials, spin-on-polymer (SOP) dielectric materials, nanoporous dielectric materials, amorphous carbon dielectric materials and fluorosilicate glass (FSG) dielectric materials, the present invention provides particular value under circumstances where the blanket first dielectric layer 16 and the blanket second dielectric layer 20 are formed of a porous dielectric material, and in particular a nanoporous dielectric material, generally having a particularly low dielectric constant in a range of from about 1.2 to about 3.7. Such porous dielectric materials typically also generally have an enhanced permeability for mobile chemical species. Typically and preferably, each of the blanket first dielectric layer 16 and the blanket second dielectric layer 20 is formed to a thickness of from about 100 to about 10,000 angstroms and each of the blanket first dielectric layer 16 and the blanket second dielectric layer 20 is formed of the same dielectric material, although such limitation is not required within the present invention and the preferred embodiment of the present invention.

Finally, within the preferred embodiment of the present invention with respect to the pair of patterned first photoresist layers 24a and 24b, the pair of patterned first photoresist layers 24a and 24b may be formed from any of several photoresist materials as are conventional in the art of microelectronic fabrication, including but not limited to photoresist materials selected from the general groups of photoresist materials including but not limited to positive photoresist materials and negative photoresist materials. Typically and preferably, each of the pair of patterned first photoresist layers 24a and 24b is formed to a thickness of from about 100 to about 10,000 angstroms.

As is understood by a person skilled in the art, the pair of patterned first photoresist layers 24a and 24b defines the location of an a really enclosed via, of linewidth from about 0.07 to about 0.25 microns, to be formed through the blanket third etch stop/planarizing stop layer 22, the blanket second dielectric layer 20, the blanket second etch stop layer 18, and the blanket first dielectric layer 16, in order to ultimately access the contact region 12.

Figure 2:
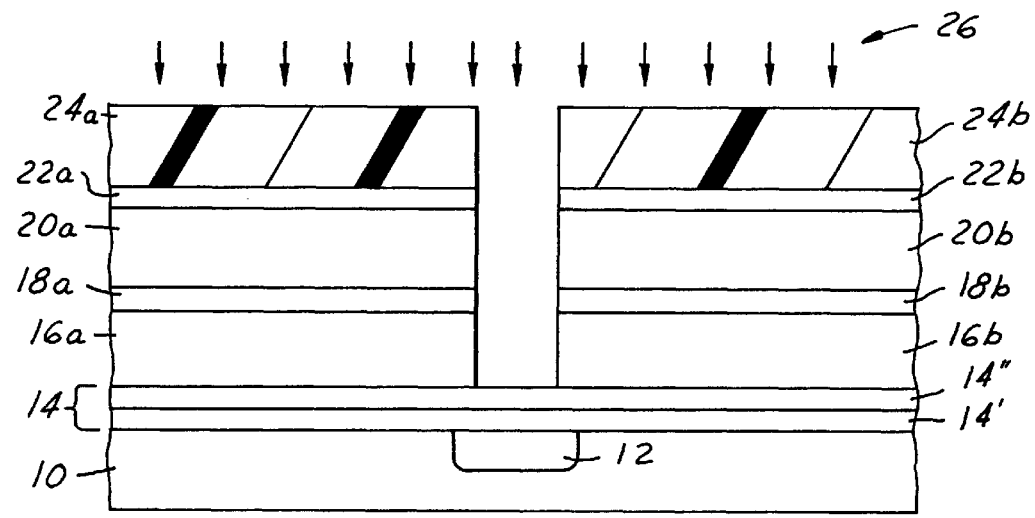

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein: (1) the blanket third etch stop/planarizing stop layer 22 has been patterned to form a pair of patterned third etch stop/planarizing stop layers 22a and 22b; (2) the blanket second dielectric layer 20 has been patterned to form a pair of patterned second dielectric layers 20a and 20b; (3) the blanket second etch stop layer 18 has been patterned to form a pair of patterned second etch stop layers 18a and 18b; and (4) the blanket first dielectric layer 16 has been patterned to form a pair of patterned first dielectric layers 16a and 16b, while employing the pair of patterned photoresist layers 24a and 24b as a first etch mask layer and while employing the blanket first etch stop/liner layer 14 as an etch stop layer, in conjunction with a first etching plasma 26.

Within the preferred embodiment of the present invention, the first etching plasma 26 will typically and preferably employ an etchant gas composition, or a sequential combination of etchant gas compositions, as appropriate to the materials from which are formed the blanket third etch stop/planarizing stop layer 22, the blanket second dielectric layer 20, the blanket second etch stop layer 18 and the blanket first dielectric layer 16. Typically and preferably, the etchant gas composition will employ, at least in part, a fluorine containing etchant gas composition.

Figure 3:
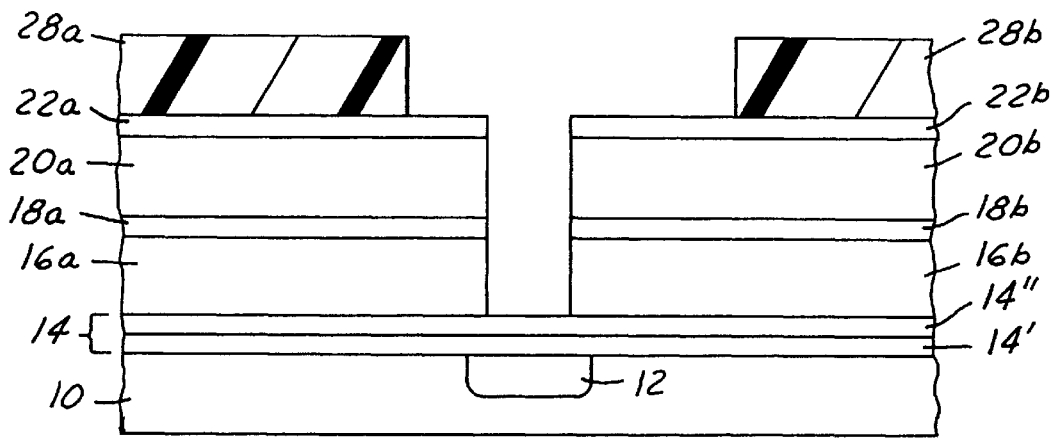

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, the pair of patterned photoresist layers 24a and 24b has been stripped from the pair of patterned third etch stop/planarizing stop layers 22a and 22b.

Within the present invention and the preferred embodiment of the present invention, the pair of patterned photoresist layers 24a and 24b may be stripped from the pair of patterned third etch stop/planarizing stop layers 22a and 22b to provide in part the microelectronic fabrication whose schematic cross-sectional diagram is illustrated in FIG. 3 from the microelectronic fabrication whose schematic cross-sectional diagram is illustrated in FIG. 2 while employing methods as are conventional in the art of microelectronic fabrication, including but not limited to wet chemical stripping methods and dry plasma stripping methods.

Shown also within the schematic cross-sectional diagram of FIG. 3, and formed upon the pair of patterned third etch stop/planarizing stop layers 22a and 22b is a corresponding pair of patterned second photoresist layers 28a and 28b, which, as is understood by a person skilled in the art, are employed for defining the location of a trench to be formed through the pair of patterned third etch stop/planarizing stop layers 22a and 22b and the pair of patterned second dielectric layers 20a and 20b, wherein the trench is contiguous with, larger than and overlaps with a via defined in part by the pair of patterned second etch stop layers 18a and 18b and the patterned first dielectric layers 16a and 16b.

As is understood by a person skilled in the art, the pair of patterned second photoresist layers 28a and 28b is typically and preferably formed employing a photolithographic method which employs coating, photo exposure and development of a blanket photoresist layer. Incident to present invention, it has been observed that by employing within the context of the present invention and the preferred embodiment of the present invention the blanket first etch stop/liner layer 14 formed of the blanket lower lying first etch stop/liner layer 14' formed of the carbon doped silicon nitride material having formed thereupon the blanket upper lying first etch stop/liner layer 14" formed of the carbon doped silicon oxide material, that the carbon doped silicon oxide material apparently serves as an effective barrier such as to avoid diffusion therethrough of species which provide for photoresist residue formation within the via when forming the pair of patterned second photoresist layers 28a and 28b. Within the present invention and the preferred embodiment of the present invention, and insofar as the blanket photoresist layer from which is formed the pair of patterned photoresist layers 28a and 28b is typically and preferably formed of a positive photoresist material which may often employ a photo generated acid initiator to solubilize the positive photoresist material within a positive photoresist material developer solution, it is assumed within the context of the present invention and the preferred embodiment of the present invention that nitrogen species, such as but not limited to alkaline ammine species, which might otherwise diffuse from the carbon doped silicon nitride material from which is formed the blanket lower lying first etch stop/liner layer 14a' are blocked by the carbon doped silicon oxide material from which is formed the blanket upper lying first etch stop/liner layer 14a".

Figure 4:
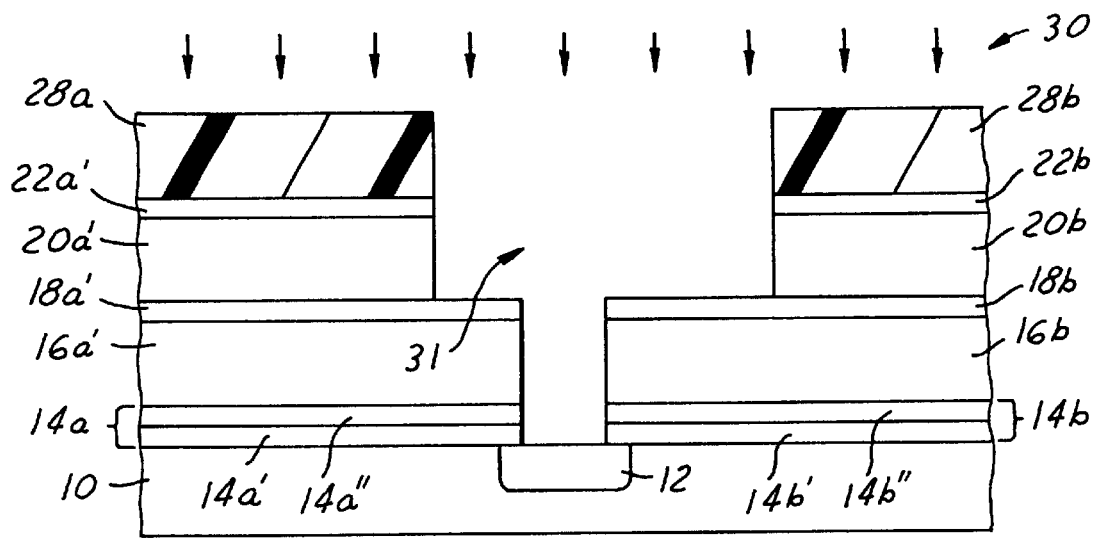

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein: (1) the pair of patterned third etch stop/planarizing stop layers 22a and 22b has been further etched to form a pair of twice patterned third etch stop/planarizing stop layers 22a' and 22b'; (2) the pair of patterned second dielectric layers 20a and 20b has been further patterned to form a pair of twice patterned second dielectric layers 20a' and 20b'; and (3) the blanket first etch stop/liner layer 14 has been patterned to form a pair of patterned first etch stop/liner layers 14a and 14b which exposes the contact region 12, while employing the pair of patterned second photoresist layers 28a and 28b as a second etch mask layer and the pair of patterned second etch stop layers 18a and 18b as a pair of etch stop layers, in conjunction with a second etching plasma 30, to thus form a dual damascene aperture 31. As is understood by a person skilled in the art, the dual damascene aperture 32 comprises: (1) a trench defined by the pair of twice patterned third etch stop/planarizing stop layers 22a' and 22b' and the pair of twice patterned second dielectric layers 20a' and 20b', where the trench is of areal dimensions greater than and overlapping; (2) a via defined by the pair of patterned second etch stop layers 18a and 18b, the pair of patterned first dielectric layers 16a and 16b and the pair of patterned first etch stop/liner layers 14a and 14b.

Within the present invention and the preferred embodiment of the present invention, the second etching plasma 30 will typically and preferably employ materials and process limitations analogous or equivalent to the materials and process limitations as are employed for forming the first etching plasma 26 as illustrated within the schematic cross-sectional diagram of FIG. 2.

Figure 5:
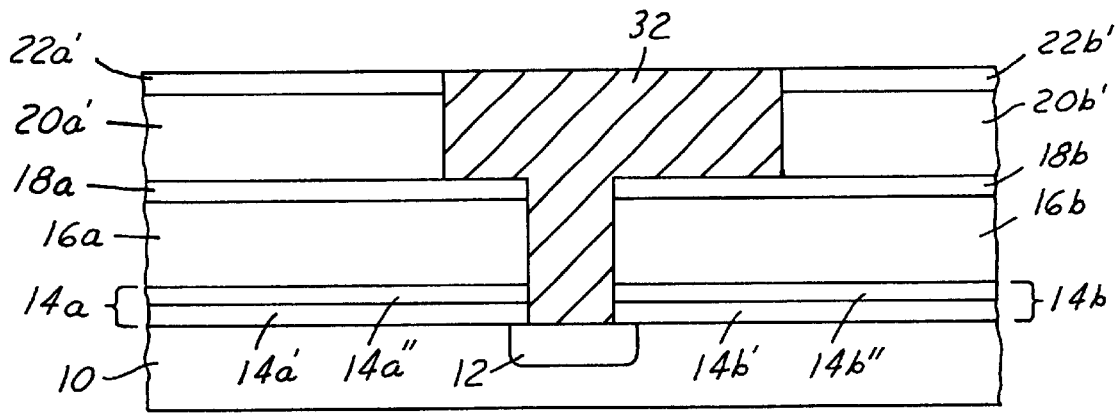

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein, in a first instance, the pair of patterned second photoresist layers 28a and 28b has been stripped from the pair of twice patterned third etch stop/planarizing stop layers 22a' and 22b'. Within the present invention and the preferred embodiment of the present invention, the pair of patterned second photoresist layers 28a and 28b may be stripped from the pair of twice patterned third etch stop/planarizing stop layers 22a' and 22b' while employing methods and material analogous or equivalent to the methods and materials employed for stripping from the pair of patterned third etch stop/planarizing stop layers 22a and 22b the pair of patterned first photoresist layers 24a and 24b as illustrated within the schematic cross-sectional diagram of FIG. 2, to provide in part the microelectronic fabrication whose schematic cross-sectional diagram is illustrated in FIG. 3.

Finally, there is also shown within the schematic cross-sectional diagram of FIG. 5, and formed into the dual damascene aperture 31 a contiguous patterned conductor interconnect and patterned conductor stud layer 32.

As is understood by a person skilled in the art, the contiguous patterned conductor interconnect and patterned conductor stud layer 32 is formed employing methods as are conventional in the art of microelectronic fabrication, and in particular chemical mechanical polish (CMP) planarizing methods. Within the preferred embodiment of the present invention, the contiguous patterned conductor interconnect and patterned conductor stud layer 32 may be formed of materials including but not limited to metal, metal alloy, doped polysilicon and polycide (doped polysilicon/metal silicide stack) materials, although metal and metal alloy materials, and in particular copper and copper alloy materials, are particularly preferred. Similarly, and although not specifically illustrated within the schematic cross-sectional diagram of FIG. 5, the contiguous patterned conductor interconnect and patterned conductor stud layer 32 typically and preferably has formed as its lower portion a barrier layer which inhibits interdiffusion of the contiguous patterned conductor interconnect and patterned conductor stud layer 32 with the series of patterned dielectric and etch stop layers with which it is adjacent within the dual damascene aperture 31 whose schematic cross-sectional diagram is illustrated in FIG. 5.

Upon forming the microelectronic fabrication whose schematic cross-sectional diagram is illustrated in FIG. 5, there is provided by the present invention a damascene method for forming within a microelectronic fabrication a patterned microelectronic conductor layer having formed interposed between its patterns a microelectronic dielectric layer formed of a comparatively low dielectric constant dielectric material, wherein the patterned microelectronic conductor layer is formed with enhanced reliability.

The present invention realizes the foregoing object by forming upon a substrate employed within a microelectronic fabrication a barrier layer, where the barrier layer comprises: (1) a carbon doped silicon nitride layer formed upon the substrate; and (2) a carbon doped silicon oxide layer formed upon the carbon doped silicon nitride layer.

Within the method of the present invention, and when the barrier layer is formed as a first etch stop/liner layer upon a substrate having formed therein a contact region which is accessed employing a damascene structure within the microelectronic fabrication, the method of the present invention provides for: (1) attenuated oxidation of the contact region when forming the first etch stop/liner layer; and (2) attenuated residue formation when forming, photo exposing and developing a photoresist layer upon the first etch stop/barrier layer, thus in turn providing enhanced reliability of a patterned conductor layer formed within the damascene structure within which is formed the barrier layer of the present invention.

As is understood by a person skilled in the art, the preferred embodiment of the present invention is illustrative of the present invention rather than limiting of the present invention. Revisions and modifications may be made to methods, materials, structures and dimensions through which is provided a dual damascene structure in accord with the preferred embodiment of the present invention, which still providing a method for fabricating a microelectronic fabrication in accord with the present invention, further in accord with the accompanying claims.

What is claimed is:

1. A method for forming a microelectronic fabrication comprising:
    providing a substrate;
    forming upon the substrate a barrier layer, the barrier layer comprising:
        a carbon doped silicon nitride layer formed upon the substrate; and
        a carbon doped silicon oxide layer formed upon the carbon doped silicon nitride layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the carbon doped silicon nitride layer is formed to a thickness of from about 10 to about 1,000 angstroms.

4. The method of claim 1 wherein the carbon doped silicon oxide layer is formed to a thickness of from about 10 to about 1,000 angstroms.

5. The method of claim 1 wherein:
    the carbon doped silicon nitride layer is formed employing a plasma enhanced chemical vapor deposition (PECVD) method employing a first organosilane silicon and carbon source material with a nitrogen source material; and
    the carbon doped silicon oxide layer is formed employing a plasma enhanced chemical vapor deposition (PECVD) method employing a second organosilane silicon and carbon source material with an oxygen source material.

6. The method of claim 5 wherein:

the first organosilane silicon and carbon source material is the same as the second organosilane silicon and carbon source material;

the nitrogen source material is selected from the group consisting of nitrogen, ammonia and hydrazine; and the oxygen source material is selected from the group consisting of carbon monoxide and carbon dioxide.

7. The method of claim 1 wherein by employing when forming the barrier layer the carbon doped silicon nitride layer formed upon the substrate and the carbon doped silicon oxide layer formed thereupon, there is attenuated oxidation of the substrate when forming thereupon the barrier layer.

8. The method of claim 1 further comprising forming, photo exposing and developing in contact with the barrier layer a photoresist layer, wherein by employing when forming the barrier layer the carbon doped silicon oxide layer formed upon the carbon doped silicon nitride layer there is attenuated a photoresist residue when forming, photo exposing and developing in contact with the barrier layer the photoresist layer.

9. A method for forming a semiconductor integrated circuit microelectronic fabrication comprising:

providing a semiconductor substrate;

forming upon the semiconductor substrate a barrier layer, the barrier layer comprising:
  a carbon doped silicon nitride layer formed upon the semiconductor substrate; and
  a carbon doped silicon oxide layer formed upon the carbon doped silicon nitride layer.

10. The method of claim 9 wherein the carbon doped silicon nitride layer is formed to a thickness of from about 10 to about 1,000 angstroms.

11. The method of claim 9 wherein the carbon doped silicon oxide layer is formed to a thickness of from about 10 to about 1,000 angstroms.

12. The method of claim 9 wherein:

the carbon doped silicon nitride layer is formed employing a plasma enhanced chemical vapor deposition (PECVD) method employing a first organosilane silicon and carbon source material with a nitrogen source material; and the carbon doped silicon oxide layer is formed employing a plasma enhanced chemical vapor deposition (PECVD) method employing a second organosilane silicon and carbon source material with an oxygen source material.

13. The method of claim 12 wherein:

the first organosilane carbon and silicon source material is the same as the second carbon and silicon source material;

the nitrogen source material is selected from the group consisting of nitrogen, ammonia and hydrazine; and the oxygen source material is selected from the group consisting of carbon monoxide and carbon dioxide.

14. The method of claim 9 wherein by employing when forming the barrier layer the carbon doped silicon nitride layer formed upon the substrate and the carbon doped silicon oxide layer formed thereupon, there is attenuated oxidation of the substrate when forming thereupon the barrier layer.

15. The method of claim 9 further comprising forming, photo exposing and developing in contact with the barrier layer a photoresist layer, wherein by employing within the barrier layer the carbon doped silicon oxide layer formed upon the carbon doped silicon nitride layer there is attenuated a photoresist residue when forming, photo exposing and developing in contact with the barrier layer the photoresist layer.

* * * * *